United States Patent
Hurbi

(10) Patent No.: US 10,378,798 B2
(45) Date of Patent: Aug. 13, 2019

(54) ELECTROMAGNETIC PUMPING OF PARTICLE DISPERSION

(71) Applicant: MICROSOFT TECHNOLOGY LICENSING, LLC, Redmond, WA (US)

(72) Inventor: Erin Hurbi, San Francisco, CA (US)

(73) Assignee: MICROSOFT TECHNOLOGY LICENSING, LLC, Redmond, WA (US)

(*) Notice: Subject to any disclaimer, the term of this patent is extended or adjusted under 35 U.S.C. 154(b) by 543 days.

(21) Appl. No.: 14/752,263

(22) Filed: Jun. 26, 2015

(65) Prior Publication Data

US 2016/0377328 A1  Dec. 29, 2016

(51) Int. Cl.
| F25B 21/00 | (2006.01) |
| C09K 5/10 | (2006.01) |
| F28D 15/00 | (2006.01) |
| H02K 44/02 | (2006.01) |
| H05K 7/20 | (2006.01) |
| G02B 27/01 | (2006.01) |
| G06F 1/16 | (2006.01) |

(Continued)

(52) U.S. Cl.
CPC ............. *F25B 21/00* (2013.01); *C09K 5/10* (2013.01); *F28D 15/00* (2013.01); *G02B 27/017* (2013.01); *G06F 1/163* (2013.01); *G06F 1/203* (2013.01); *G06F 3/011* (2013.01); *H02K 44/02* (2013.01); *H05K 7/20272* (2013.01); *F28F 2250/08* (2013.01); *F28F 2255/02* (2013.01); *G02B 2027/0178* (2013.01)

(58) Field of Classification Search
CPC ........................................................ F25B 21/00
See application file for complete search history.

(56) References Cited

U.S. PATENT DOCUMENTS

| 4,805,988 A | 2/1989 | Dones |
| 5,186,919 A | 2/1993 | Bunnell |

(Continued)

FOREIGN PATENT DOCUMENTS

| CN | 103073891 A | 5/2013 |
| DE | 102009029758 A1 | 12/2010 |
| WO | 2013040636 A1 | 3/2013 |

OTHER PUBLICATIONS

"Enhanced heat transfer is dependent on thickness of graphene films: the heat dissipation during boiling," by Ahn et. al., Scientific Reports, Sep. 3, 2014, all pages.*

(Continued)

*Primary Examiner* — Filip Zec
(74) *Attorney, Agent, or Firm* — Alleman Hall Creasman & Tuttle LLP

(57) ABSTRACT

Examples are disclosed herein that relate to a heat removal system utilizing a dispersion that includes particles of an electrical conductor. One example provides a heat removal system including a conduit loop, a dispersion of particles of an electrical conductor in a heat transfer fluid, a pair of electrodes configured to introduce a flow of electric current through the particles in the dispersion, and one or more magnets configured to introduce a magnetic field within the conduit loop in a region of the pair of electrodes, such that the electrodes are operable to apply an electromagnetic pumping force on the particles in the dispersion.

18 Claims, 4 Drawing Sheets

(51) Int. Cl.
*G06F 1/20* (2006.01)
*G06F 3/01* (2006.01)

(56) References Cited

U.S. PATENT DOCUMENTS

| | | | |
|---|---|---|---|
| 5,763,951 A | 6/1998 | Hamilton et al. | |
| 6,733,244 B1* | 5/2004 | Fritsch | B01F 13/0077 417/48 |
| 6,849,849 B1 | 2/2005 | Warner et al. | |
| 7,824,651 B2 | 11/2010 | Zhamu et al. | |
| 8,192,643 B2 | 6/2012 | Zheng et al. | |
| 8,357,858 B2 | 1/2013 | Khosla et al. | |
| 8,691,179 B2 | 4/2014 | Kim et al. | |
| 9,488,389 B2* | 11/2016 | Conrad | F25B 9/14 |
| 2005/0139345 A1 | 6/2005 | Pokharna et al. | |
| 2009/0031733 A1* | 2/2009 | Weaver, Jr. | F25B 21/00 62/3.6 |
| 2009/0126922 A1* | 5/2009 | Vetrovec | F25B 21/00 165/185 |
| 2010/0037624 A1* | 2/2010 | Epstein | F25B 21/00 62/3.1 |
| 2010/0066178 A1 | 3/2010 | Lower et al. | |
| 2011/0140033 A1 | 6/2011 | Chen et al. | |
| 2011/0289924 A1* | 12/2011 | Pietsch | F28D 20/0056 60/682 |
| 2013/0217222 A1 | 8/2013 | Johnson et al. | |
| 2014/0050920 A1 | 2/2014 | Ray et al. | |
| 2014/0120399 A1 | 5/2014 | Balandin | |
| 2014/0253866 A1 | 9/2014 | Carabajal | |
| 2015/0033762 A1* | 2/2015 | Cheng | F25B 21/00 62/3.1 |

OTHER PUBLICATIONS

ISA European Patent Office, International Search Report and Written Opinion Issued in PCT Application No. PCT/US2016/037463, dated Jan. 20, 2017, WIPO, 15 Pages. (356857-WO-PCT).

Dan, Budhadipta., "SWNT and Graphene Colloidal Dispersions: Phase behavior, Material Fabrication and Characterization", In Thesis, Apr. 2011, 207 pages.

Chae, et al., "Carbon Nanotubes and Graphene towards Soft Electronics", In Proceedings of Nano Convergence, vol. 1, Issue 15, Apr. 2014, 26 pages.

Le, et al., "Inkjet-Printed Graphene-Based Wireless Gas Sensor Modules", In Proceedings of IEEE 62nd Electronic Components and Technology Conference, May 29, 2012, pp. 1003-1008.

Zheng, et al., "Reversible Temperature Regulation of Electrical and Thermal Conductivity using Liquid-Solid Phase Transitions", In Journal of Nature Communications, Apr. 19, 2011, 11 pages.

Xu, et al., "Graphene in Macroscopic Order: Liquid Crystals and Wet-Spun Fibers", In Proceedings of Accounts of Chemical Research, vol. 47, Issue 4, Feb. 20, 2014, pp. 861-867.

Shahil, et al., "Graphene-Multilayer Graphene Nanocomposites as Highly Efficient Thermal Interface Materials", In Proceedings of Nano Letter, vol. 12, Jan. 3, 2012, pp. 861-867.

IPEA European Patent Office, International Preliminary Report on Patentability Issued in PCT Application No. PCT/US2016/037463, dated May 9, 2017, WIPO, 6 Pages.

* cited by examiner

ELECTROMAGNETIC PUMPING OF PARTICLE DISPERSION

BACKGROUND

Many types of devices utilize heat transfer systems to cool heat-producing components. For example, computing device components such as processors may generate significant amounts of heat under some operating conditions. As such heat may affect device performance and/or lifetime, a device may utilize various cooling systems, such as heat sinks, fans, heat pipes, and the like to control the device temperature.

SUMMARY

Examples are disclosed herein that relate to heat removal systems utilizing dispersions of electrically conductive particles. One example provides a heat removal system including a conduit loop, a dispersion of an electrical conductor in a heat transfer fluid disposed in the conduit loop, a pair of electrodes configured to introduce a flow of electric current through the particles in the dispersion, and one or more magnets configured to introduce a magnetic field within the conduit loop in a region of the pair of electrodes, such that the electrodes are operable to apply an electromagnetic pumping force on the particles in the dispersion.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

As mentioned above, electronic devices may utilize various heat removal methods to move heat away from heat-producing device components, such as a processing unit. For example, active cooling methods utilize moving parts (e.g. cooling fans), which may create noise and/or vibration that affect other device components (e.g. optical components, inertial measuring components). Passive cooling methods, such as the use of heat sinks, air circulation, convection, and/or heat pipes, may be bulky and thus not suitable for some devices, such as wearable devices. Likewise, heat pipes may be inflexible and thus may be highly stressed or loaded when used in a device with parts that can move, such as a head-mounted display device configured to fit heads of different sizes. A flexible bellows system in the pipe may be included in such an implementation to help to mitigate stress. However, such bellows may be costly to manufacture. Other cooling systems, such as heat pumps which pump liquid metal, may likewise be undesirably heavy as well as costly to produce.

Accordingly, examples are disclosed herein that relate to heat removal systems that may be implemented in flexible portions of a device, may withstand stress and physical deformation, and may provide quiet and vibration-free operation. Briefly, the disclosed examples utilize a conduit loop containing a dispersion of particles of an electrical conductor in a heat transfer fluid. The examples further include a pair of electrodes to introduce a flow of electric current through the particles of the electrical conductor, and one or more magnets for introducing a magnetic field in the region of the pair of electrodes. The electric current and magnetic field may act to move the particles via the Lorentz force, and movement of the particles may cause movement of the heat transfer fluid. Further, the conduit loop may be formed at least partially from flexible materials. This may provide a lightweight and quiet heat removal system that can be routed through portions of devices that move or flex during use.

Figure 1:
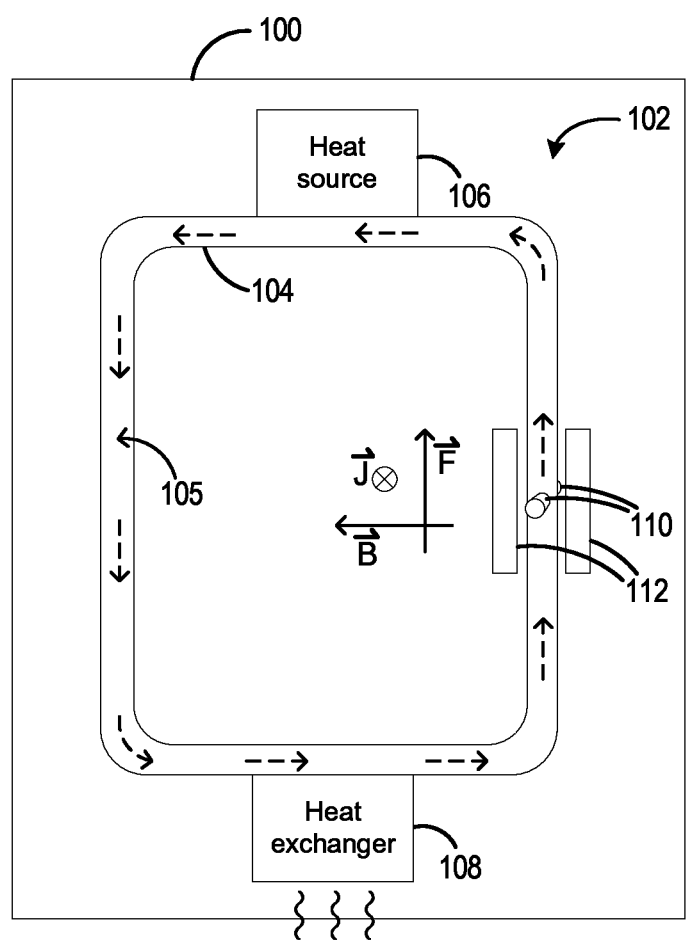
FIG. 1 is a block diagram illustrating an example heat removal system in a device.

FIG. 1 schematically illustrates a device 100 incorporating an example heat removal system 102. Heat removal system 102 includes a conduit loop 104 containing a heat transfer fluid 105 configured to move heat from a heat source 106 to a heat exchanger 108. The heat source 106 may represent any suitable heat-producing component, or a part which receives heat from heat-generating components as part of a thermal path. The heat exchanger 108 may dissipate heat transferred by the heat transfer fluid in the conduit loop 104 into a surrounding medium, such as air. In other examples, the heat exchanger 108 may be omitted, as the heat may dissipate sufficiently throughout the length of the conduit loop. It will be understood that device 100 may represent any suitable device, including but not limited to wearable computing devices as described herein.

In contrast to a two-phase heat pipe, which cycles a working fluid from liquid to vapor to transfer heat, the heat transfer fluid 105 remains in liquid phase throughout the entire heat transfer cycle. As illustrated by the arrows in the conduit loop 104, the heat transfer fluid 105 moves throughout the conduit loop 104 to absorb heat generated by the heat source 106 and to the heat exchanger 108 to release the heat, and returns as cooled liquid back to the heat source 106.

Figure 2:
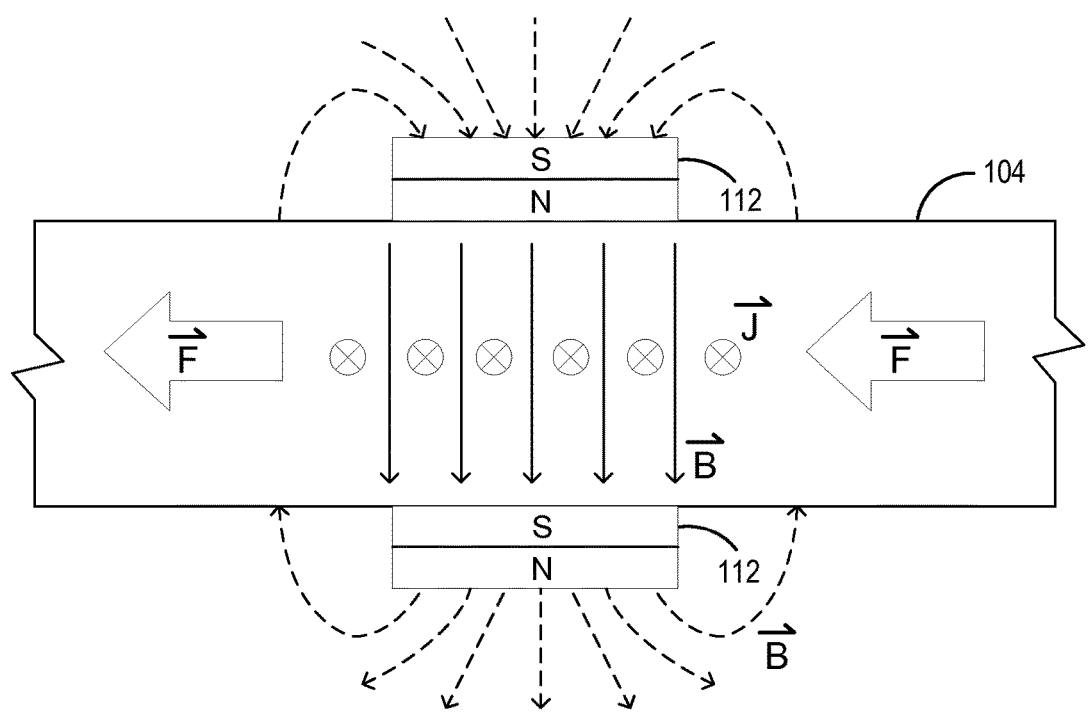
FIG. 2 shows a schematic sectional view of an example heat removal system.

As mentioned above, the heat removal system 102 may utilize electromagnetic forces to move the heat transfer fluid 105 through the conduit loop 104 using the Lorentz force. As such, the heat removal system 102 includes a pair of electrodes 110 configured to introduce a flow of electric current through the particles in the heat transfer fluid 105, and magnets 112 configured to introduce a magnetic field within the conduit loop 104 in the region of the pair of electrodes 110. FIG. 2 illustrates a section of the conduit loop 104 in more detail. The electrodes 110 are connected to a power supply (not shown), and are configured to introduce an electric current through the conduit loop in a direction approximately normal to a surface of the page. The current introduced by the pair of electrodes 110 is represented by current density vector $\bar{j}$, which represents the electric current per cross-sectional area at a given point along the conduit loop, and is directed perpendicularly into the page. Magnets 112, each having north and south poles as shown in FIG. 2, may be oriented to introduce a magnetic field $\bar{B}$ within the conduit loop 104 in the region of the electrodes 110 directed approximately perpendicularly to the current density vector $\bar{j}$. While a single set of electrodes and magnets is shown in FIG. 1, any suitable number of sets of magnets and electrodes may be used at various points along the conduit loop 104 to move the particles of the heat transfer fluid 105 throughout the conduit loop 104.

Due to the Lorentz force, an electrically conductive entity within the conduit loop 104 experiences a force $\bar{F}$ in a direction perpendicular to both $\bar{B}$ and $\bar{j}$. While electrically conductive fluids such as liquid gallium or mercury may be pumped via a Lorentz force pump, the use of such fluids may pose difficulties regarding expense and/or safety. Thus, a safer and/or less expensive heat transfer fluid 105, such as water, may be used in combination with a material that allows the water to be moved via the Lorentz force. Water may be particularly advantageous to use as a heat transfer fluid due to the above-mentioned safety and cost concerns, as well as due to the relatively high specific heat of water.

Water potentially may be moved through the conduit loop via a Lorentz force pump via dissolved ions. However, the dissolved ions may give rise to electrochemical reactions at the electrodes used for the Lorentz pump. Such electrochemical reactions may produce undesirable reaction products, such as various gases, depending upon the nature of the reactions.

Thus, a heat transfer fluid 105 may include a dispersion of particles of an electrically conductive material, as opposed to an ionic solution, to enable Lorentz force pumping to be performed. Any suitable conductive particles may be used. In some examples, the heat transfer fluid 105 may utilize particles of an isotropic electrical conductor, such as a metallic material. In other examples, the heat-transfer fluid may utilize an anisotropic electrical conductor. An anisotropic electrical conductor has different electrical conductivities in different crystallographic directions. When an electric field is applied to particles of an anisotropic electrical conductor, the particles may align with the electric field according to their anisotropic electrical properties. In either, such electrical conductors may be moved by the Lorentz force, and thereby may cause the motion of the heat transfer fluid 105 through the conduit loop 104.

Any suitable electrically conductive particle may be used. Graphene-based materials are non-limiting examples of electrical conductors that may be used to move the heat transfer fluid 105 within the conduit loop 104. The term graphene-based material as used herein represents forms of carbon that are formed from extended structures of six-membered carbon rings, including but not limited to synthetic and natural graphite, single and multi-layer graphene nanostructures (e.g. graphene-based flakes), and carbon nanotubes. Such structures have a higher electrical conductivity along the plane of the rings than in a direction normal to the rings. In other examples, any other suitable electrical conductor may be used.

Figure 3:
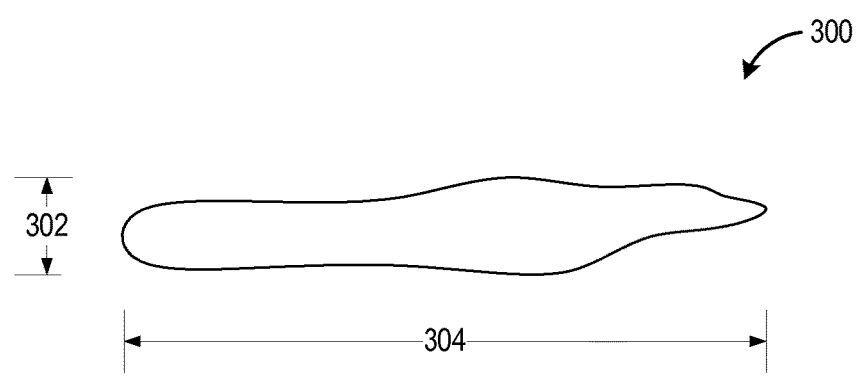
FIG. 3 shows an example particle of an electrical conductor.

The use of particles with a high aspect ratio may help to push more fluid per mass or volume of particle than particles of lower aspect ratios. FIG. 3 shows an example particle in the form of a graphene-based flake 300 as viewed from a side. Such a graphene-based flake 300 may have a thickness 302 of 1-50 layers of graphene. A dimension 304 of the particles in a direction along the plane of the carbon ring structure may depend upon an inner diameter of the conduit loop, which in some examples may be on the order of 1-10 millimeters. In other examples, the flakes and conduit may have any other suitable dimensions.

Figure 4:
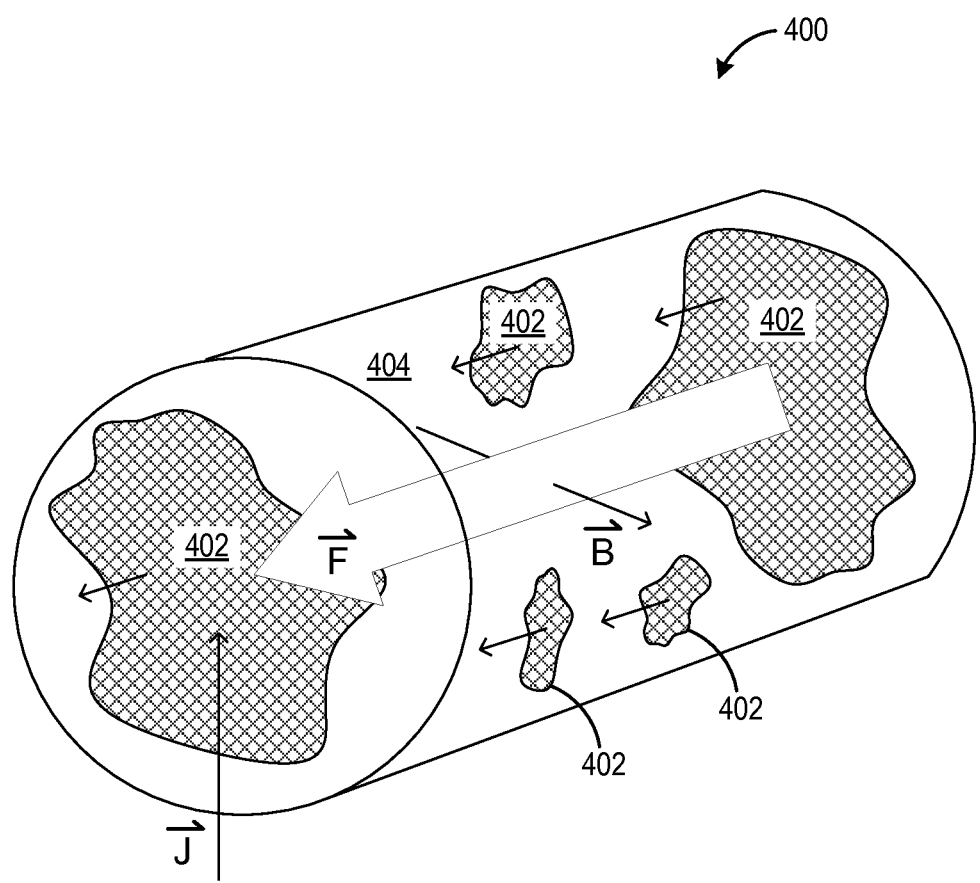
FIG. 4 shows a view of a dispersion of particles of an electrical conductor flowing within a conduit.

FIG. 4 shows a schematic sectional view of a conduit 400 carrying a dispersion of graphene-based flakes 402 dispersed in a heat transfer fluid 404. Vectors $\bar{j}$, $\bar{B}$, and $\bar{F}$ as described above are shown in FIG. 4 to illustrate the motion of the dispersion and the graphene-based flakes 402. In this example, some graphene-based particles are shown as substantially spanning a diameter of the conduit 400. Such particles may conduct current between electrodes on opposite sides of the conduit 400. Other flakes that are smaller may conduct current when multiple flakes bridge the space between the electrodes. The heat transfer fluid may include any suitable concentration of flakes. The concentration of flakes utilized may depend at least in part upon an average size of flakes in the dispersion. Suitable concentrations include, but are not limited to, concentrations in a range of 0.1%-10% by volume. In other examples the concentrations may be higher or lower than this range.

Figure 5:
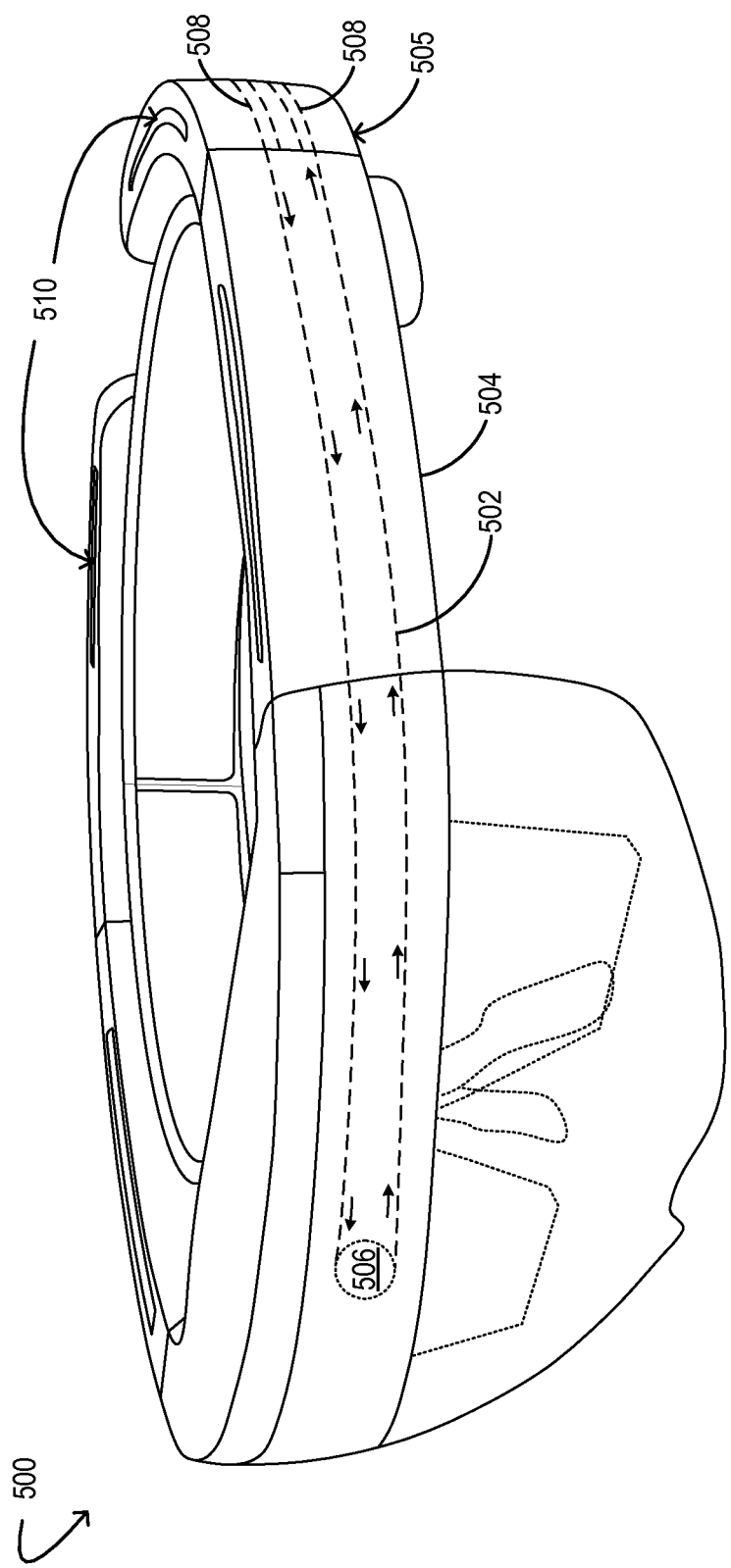
FIG. 5 shows an example device that may utilize the heat removal system as disclosed herein.

A heat removal system according to the present disclosure may be implemented in any suitable device, including but not limited to a wearable computing device. FIG. 5 schematically illustrates an example of a wearable computing device in the form of a head-mounted display device 500 including a heat removal system as disclosed herein. A conduit loop 502 of the heat removal system may run along a band 504 of the device 500 configured to be worn around a person's head. This path may include a movable region, such as flexible or hinged portion 505 at which the band 504 may move to accommodate different head sizes. A heat transfer fluid disposed in conduit loop 502 may receive heat generated from a heat source 506 and transfer heat along the conduit loop 502 to heat exchangers 508, and then back along the conduit loop 502 to the heat source 506, as indicated by arrows. The heat source 506 may represent any suitable heat-producing electrical component in the device. The heat exchangers 508 may facilitate heat dissipation into the surrounding environment of the device, such as via vents 510 to facilitate removal of heat from the device, and may be omitted in some implementations. It will be understood that the conduit loop 502 may have any suitable size and shape. It further will be understood that a device may include more than one heat removal system.

Another example provides a heat removal system, comprising a conduit loop, a dispersion of particles of an electrical conductor in a heat transfer fluid disposed within the conduit loop, a pair of electrodes to introduce a flow of electric current through the particles in the dispersion, and one or more magnets to introduce a magnetic field within the conduit loop in a region of the pair of electrodes, such that the electrodes are operable to apply an electromagnetic pumping force on the particles in the dispersion. The particles of the electrical conductor may additionally or alternatively include graphene-based particles. In this example, the graphene-based particles may additionally or alternatively include flakes. The graphene-based particles may additionally or alternatively have an average thickness of 1-50 monolayers of graphene. A concentration of the particles of the electrical conductor in the dispersion may additionally or alternatively be 0.1-10% by volume. The heat removal system may additionally or alternatively be incorporated in a head-mounted display device. The conduit loop may additionally or alternatively be located at least partially within a moveable portion of the head-mounted display device. The heat transfer fluid may additionally or alternatively be water.

Another example provides a heat removal system, comprising a conduit loop, a dispersion of particles of an anisotropic conductor and a heat transfer fluid disposed within the conduit loop, a pair of electrodes to introduce a flow of electric current through the particles in the dispersion, and one or more magnets to introduce a magnetic field within the conduit loop in a region of the pair of electrodes. The conduit loop may additionally or alternatively include a flexible portion. The heat removal system may additionally or alternatively be incorporated into a device, and wherein the flexible portion may additionally or alternatively be positioned within a flexible portion of the device. The device may additionally or alternatively include a head-mounted display device. The particles of the anisotropic conductor may additionally or alternatively include synthetic graphene-based flakes. The particles of the anisotropic conductor may additionally or alternatively include particles of a conductive polymer. The heat transfer fluid may additionally or alternatively include water. The heat removal system may additionally or alternatively include a heat dispersion element located along the conduit loop.

Another example provides an electronic device, comprising a heat removal system including a conduit loop, a dispersion of a graphene-based material in a heat transfer fluid disposed within the conduit loop, a pair of electrodes to introduce a flow of electric current through the graphene-based material in the dispersion, and one or more magnets to introduce a magnetic field within the conduit loop in a region of the pair of electrodes. The electronic device may additionally or alternatively include a head-mounted display. The head-mounted display may additionally or alternatively include a movable region through which the conduit loop passes. The conduit loop may additionally or alternatively be formed at least partially from a flexible material. The graphene-based material may additionally or alternatively include graphene-based flakes.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A heat removal system, comprising:
a conduit loop;
a dispersion of anisotropically conductive graphene-based flakes in a heat transfer fluid disposed within the conduit loop;
a pair of electrodes to apply an electric field across the conduit loop and thereby align the graphene-based flakes in the dispersion via the electric field, and to introduce a flow of electric current through the graphene-based flakes in the dispersion; and
one or more magnets to introduce a magnetic field within the conduit loop in a region of the pair of electrodes, such that the electrodes are operable to apply an electromagnetic pumping force on the graphene-based flakes in the dispersion to push the heat transfer fluid within the conduit loop via the graphene-based flakes as aligned by the electric field.

2. The heat removal system of claim 1, wherein the graphene-based flakes have an average thickness of 1-50 monolayers of graphene.

3. The heat removal system of claim 1, wherein a concentration of the graphene-based flakes in the dispersion comprises 0.1-10% by volume.

4. The heat removal system of claim 1, wherein the heat removal system is incorporated in a head-mounted display device.

5. The heat removal system of claim 4, wherein the conduit loop is located at least partially within a moveable portion of the head-mounted display device.

6. The heat removal system of claim 1, wherein the heat transfer fluid is water.

7. A heat removal system, comprising:
a conduit loop;
a dispersion of anisotropically conductive graphene-based flakes and a heat transfer fluid disposed within the conduit loop;
a pair of electrodes to apply an electric field across the conduit loop and thereby align the graphene-based flakes in the dispersion via the electric field, and to introduce a flow of electric current through the graphene-based flakes in the dispersion; and
one or more magnets to introduce a magnetic field within the conduit loop in a region of the pair of electrodes to push the heat transfer fluid within the conduit loop via the graphene-based flakes as aligned by the electric field.

8. The heat removal system of claim 7, wherein the conduit loop includes a flexible portion.

9. The heat removal system of claim 8, wherein the heat removal system is incorporated into a device, and wherein the flexible portion is positioned within a flexible portion of the device.

10. The heat removal system of claim 9, wherein the device comprises a head-mounted display device.

11. The heat removal system of claim 7, wherein the graphene-based flakes comprise synthetic graphene-based flakes.

12. The heat removal system of claim 7, wherein the graphene-based flakes comprise a thickness of 1-50 monolayers of graphene.

13. The heat removal system of claim 7, wherein the heat transfer fluid comprises water.

14. The heat removal system of claim 7, further comprising a heat dispersion element located along the conduit loop.

15. An electronic device, comprising:
a heat removal system including
a conduit loop,
a dispersion of anisotropically conductive graphene-based flakes in a heat transfer fluid disposed within the conduit loop,
a pair of electrodes to apply an electric field across the conduit loop and thereby align the graphene-based flakes in the dispersion via the electric field, and to introduce a flow of electric current through the graphene-based flakes in the dispersion, and
one or more magnets to introduce a magnetic field within the conduit loop in a region of the pair of electrodes to push the heat transfer fluid within the conduit loop via the graphene-based flakes as aligned by the electric field.

16. The electronic device of claim 15, wherein the electronic device comprises a head-mounted display.

17. The electronic device of claim 16, wherein the head-mounted display includes a movable region through which the conduit loop passes.

18. The electronic device of claim 15, wherein the conduit loop is formed at least partially from a flexible material.

* * * * *